(12) United States Patent
Lee et al.

(10) Patent No.: US 6,269,046 B1
(45) Date of Patent: Jul. 31, 2001

(54) SEMICONDUCTOR MEMORY DEVICE HAVING IMPROVED DECODERS FOR DECODING ROW AND COLUMN ADDRESS SIGNALS

(75) Inventors: Kyu-chan Lee; Sang-man Byun, both of Suwon (KR)

(73) Assignee: Samsung Electronics Co., Ltd., Kyunggi-do (KR)

( * ) Notice: Subject to any disclaimer, the term of this patent is extended or adjusted under 35 U.S.C. 154(b) by 0 days.

(21) Appl. No.: 09/533,530

(22) Filed: Mar. 23, 2000

(30) Foreign Application Priority Data

May 7, 1999 (KR) ................................................ 99-16347

(51) Int. Cl.[7] ..................................................... G11C 8/00
(52) U.S. Cl. ............................... 365/230.06; 365/230.08; 365/229
(58) Field of Search ......................... 365/230.06, 230.08, 365/229, 189.05, 189.09, 189.11

(56) References Cited

U.S. PATENT DOCUMENTS 5,392,253 * 2/1995 Atsumi et al. ................... 365/230.06

OTHER PUBLICATIONS

Kawahara, et al., "Subthreshold Current Reduction for Decoded–Drive by Self–Reverse Biasing", IEEE Journal of Solid–State Circuits, vol. 28, No. 11, Nov. 1993.

* cited by examiner

Primary Examiner—David Nelms
Assistant Examiner—David Lam
(74) Attorney, Agent, or Firm—F. Chau & Associates, LLP

(57) ABSTRACT

The semiconductor memory device includes a power supply voltage (Vcc) applied to the semiconductor device, a row controller for generating an output signal in response to a control signal representing one of a normal operation state and a stand-by state, and a plurality of row decoders connected between the row controller and a plurality of word lines. Each row decoder activates a corresponding word line in response to the output signal from the row controller and a row address signal from an external source, and the output signal of the row controller is a high voltage or a ground voltage when the plurality of row decoders are in a normal operation state or in a stand-by state, respectively. The semiconductor memory device also includes a column controller for generating an output signal in response to a first control signal representing one of a normal operation state and a stand-by state and a plurality of column decoders connected between the column controller and a plurality of column selection lines. Each column decoder activates a corresponding column selection line in response to the output signal from the column controller, a column address signal, and a second control signal, and the output signal of the column controller is an internal supply voltage or the ground voltage when the plurality of column decoders are in a normal operation state or in a stand-by state, respectively. The semiconductor memory device does not generate leakage current in a stand-by state.

19 Claims, 4 Drawing Sheets

SEMICONDUCTOR MEMORY DEVICE HAVING IMPROVED DECODERS FOR DECODING ROW AND COLUMN ADDRESS SIGNALS

BACKGROUND OF THE INVENTION

1. Field of the Invention

The present invention relates to a semiconductor memory device, and more particularly, to a semiconductor memory device having row and column decoders for decoding row and column address signals without generating leakage current in stand-by mode.

2. Description of the Related Art

A semiconductor memory device includes a memory cell array, a row decoder, a column decoder, sense amplifiers and data input/output lines. A memory cell array includes a plurality of memory cells connecting with word lines and pairs of bit lines for accessing data in the memory cells. The pairs of bit lines are electrically connected to the sense amplifiers under control of column selection lines from a column decoder. A row decoder decodes a row address signal received from an external source to select some of the word lines. A column decoder decodes a column address signal received from an external source to select some of the column selection lines. The row decoder is connected to drivers to drive the word lines, and the column decoder is connected to drivers to drive the column selection lines.

In a semiconductor memory device utilizing a low supply voltage, the widths of the gates of MOS (metal oxide semiconductor) transistors in row and column decoders are very small. Thus, when a slight voltage difference exists between a source and a drain of a MOS transistor while the row and column decoders are in a stand-by state, a small leakage current is generated from the MOS transistor. Since the amount of such leakage current is small, the leakage current little affects power consumption of a semiconductor memory device when the number of row and column decoders in the semiconductor memory device is small. However, the amount of leakage current increases with an increase in the number of row and column decoders in a semiconductor memory device, so that power consumption of the semiconductor memory device also increases. As larger semiconductor devices are used in applications with finite power sources, such as portable or laptop computers, the larger leakage current becomes a factor affecting performance and/or appeal.

Therefore, it would be advantageous to provide a semiconductor device having decoders for decoding row and column address signals which do not generate leakage current in a stand-by state, thereby reducing power consumption of the semiconductor device. It is also desirable to provide a semiconductor device with improved row and column decoders which do not affect the size of the semiconductor device, even in a high-integrated semiconductor device.

SUMMARY OF THE INVENTION

An object of the present invention is to provide a semiconductor memory device having a row address decoding unit which does not generate leakage current. The semiconductor memory device may utilize a low internal supply voltage.

Another object of the present invention is to provide a semiconductor memory device having a column address decoding unit which does not generate leakage current. The semiconductor memory device may also utilize a low internal supply voltage.

In an aspect of the present invention, there is provided a semiconductor device having a plurality of memory cells connecting with a plurality of word lines, comprising a power supply voltage (Vcc) applied to the semiconductor device, a row controller for generating an output signal in response to a control signal representing one of a normal operation state and a stand-by state, and a plurality of row decoders connected between the row controller and the plurality of word lines, wherein each row decoder activates a corresponding word line in response to the output signal from the row controller and a row address signal from an external source, and the output signal of the row controller is a high voltage when the plurality of row decoders are in a normal operation state, and the output signal is a ground voltage when the plurality of row decoders are in a stand-by state. Each of the plurality of row decoders comprises a pull-up portion receiving the output signal from the row controller, for generating the high voltage when the output signal of the row controller is the high voltage, a decoding portion coupled to the pull-up portion, for receiving the row address signal and decoding the received row address signal, a latch portion coupled to a node to which the pull-up portion and the decoding portion are coupled, for latching the corresponding word line of the plurality of word lines to logic low when a voltage level of the node is a first voltage level, and a driver coupled to the node and the row controller, for activating the corresponding word line when the voltage level of the node is a second voltage level, and making the corresponding word line inactive when the voltage level of the node is the first voltage level, wherein an input of the driver receives the output signal from the row controller.

According to another aspect of the present invention, a semiconductor device having a plurality of memory cells connecting with a plurality of bit line pairs which are selectively connected to corresponding input/output line pairs in response to a plurality of column selection lines to transfer data from/to an external source, comprises a column controller for receiving an internal supply voltage and for generating an output signal in response to a first control signal representing one of a normal operation state and a standby state, and a plurality of column decoders connected between the column controller and a plurality of column selection lines, wherein each column decoder activates a corresponding column selection line in response to the output signal from the column controller, a column address signal, and the output signal of the column controller is the internal supply voltage when the plurality of column decoders are in a normal operation state and is a ground voltage when the plurality of column decoders are in a stand-by state. Each column decoder comprises a pull-up portion for receiving the second control signal and outputting the internal supply voltage when the second control signal represents the stand-by state, a decoding portion coupled to an output of the pull-up portion, for providing the ground voltage at the output of the pull-up portion in response to the column address signal, a latch portion coupled to the output of the pull-up portion, for latching the corresponding column selection line to the ground voltage when the plurality of column decoders are in the standby state, and a driver coupled to the output of the pull-up portion and the column controller, for activating the corresponding column selection line when the plurality of column decoders are in the normal operation state.

Therefore, power consumption of the semiconductor memory device using a low internal supply voltage is decreased.

BRIEF DESCRIPTION OF THE DRAWINGS

The above and other objects and advantages of the present invention will become more apparent by describing in detail preferred embodiments thereof with reference to the attached drawings in which.

DESCRIPTION OF PREFERRED EMBODIMENTS

Figure 1:
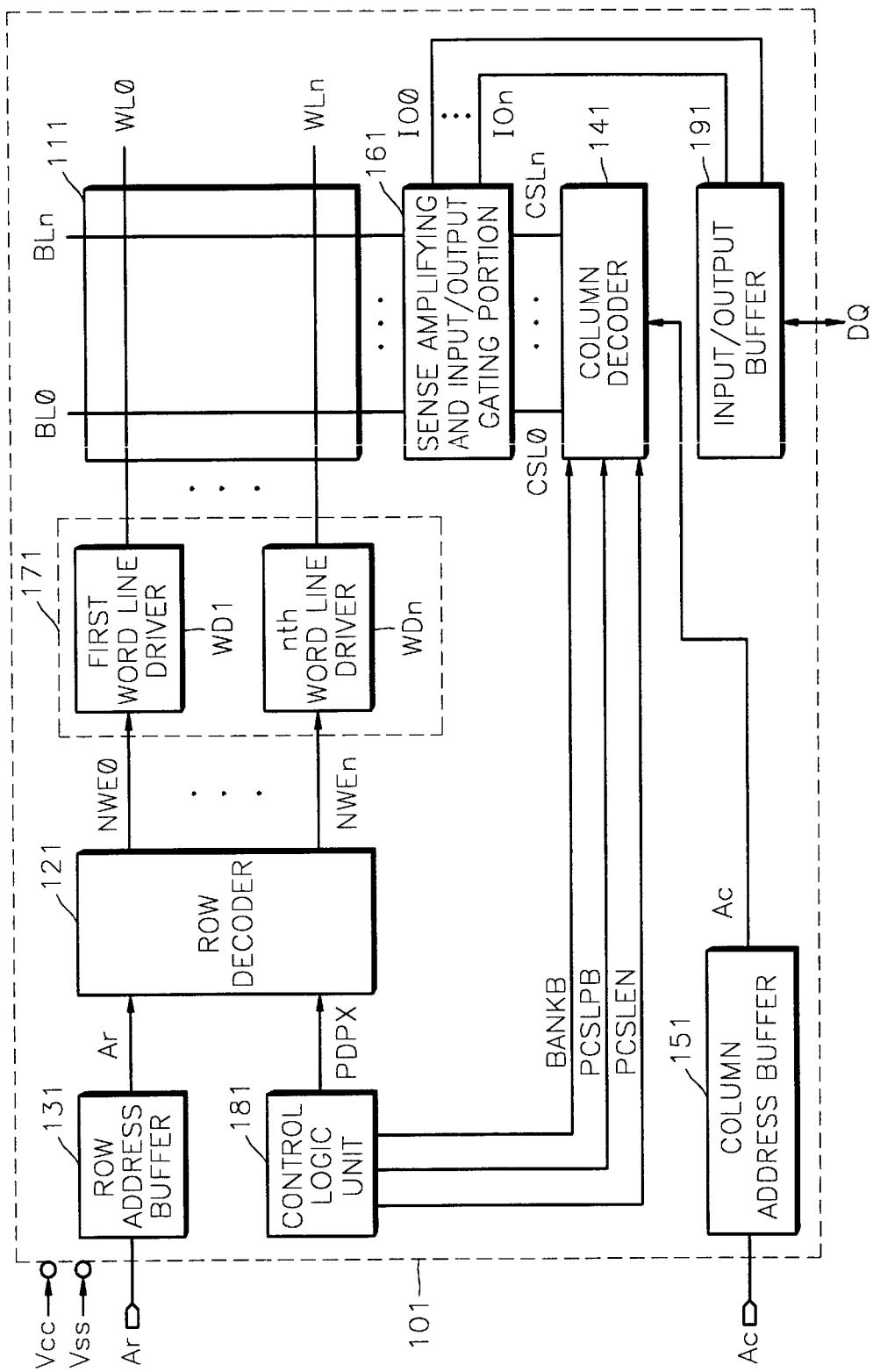
FIG. 1 is a block diagram of a general semiconductor memory device.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the same reference numerals in different drawings represent the same element.

Referring to FIG. 1, a general semiconductor memory device 101 includes a memory cell array 111, a row decoder 121, a row address buffer 131, a word line driving portion 171, a column decoder 141, a column address buffer 151, a sense amplifying and input/output gating portion 161, an input/output buffer 191, a control logic unit 181, a plurality of column selection lines CSL0, . . . , CSLn, and a plurality of pairs of input/output lines IO0, . . . , IOn. The memory cell array 111 includes a plurality of word lines WL0, . . . . , WLn, and a plurality of pairs of bit lines BL0, . . . , BLn. The word line driving portion 171 includes a plurality of word line drivers WD1, . . . , WDn.

The row address buffer 131 changes the voltage level of a row address signal Ar, which is input from an external source, into a voltage level which is suitable for the semiconductor memory device 101. The row decoder 121 decodes a row address Ar from the row address buffer 131 in response to a control signal PDPX generated by the control logic unit 181, and generates word line enable signals NWE0, . . . , NWEn. The word line driving portion 171 activates the plurality of word lines WL0, . . . , WLn in response to the corresponding word line enable signals NWE0, . . . , NWEn. The column address buffer 151 changes the voltage level of a column address signal Ac, which is input from an external source, to a voltage level which is suitable for the semiconductor memory device 101. The column decoder 141 decodes a column address Ac output from the column address buffer 151 in response to first through third control signals BANKB, PCSLPB and PCSLEN from the control logic unit 181, to activate some of the column selection lines CSL0, . . . , and CSLn. The sense amplifying and input/output gating portion 161 has a plurality of sense amplifiers for sensing and amplifying voltage levels of the plurality of bit line pairs BL0, . . . , BLn and is connected to the plurality of input/output line pairs IO0, . . . , IOn for transferring data from the plurality of sense amplifiers to an external source. The column election lines CSL0, . . . , and CSLn are selectively activated by the column decoder 141, and the bit line pairs coupled to the activated column selection lines are coupled to the corresponding input/output line pairs IO0, . . . , IOn.

When data are read from the semiconductor memory device 101, data stored in memory cells (not shown) are designated by activated word lines and loaded onto the bit line pairs BL0, . . . , BLn. In particular, only data loaded onto the bit line pairs coupled to the activated column selection lines are transferred through the input/output line pairs IO0, . . . . , IOn, to the input/output buffer 191. Also, when data are written into the semiconductor memory device 101, data from an external source is loaded onto the input/output line pairs IO0, . . . , IOn through the input/output buffer 191, and the data loaded onto the input/output line pairs IO0, . . . , IOn are stored in memory cells coupled to the activated word lines through the bit line pairs coupled to the activated column selection lines.

Figure 2:
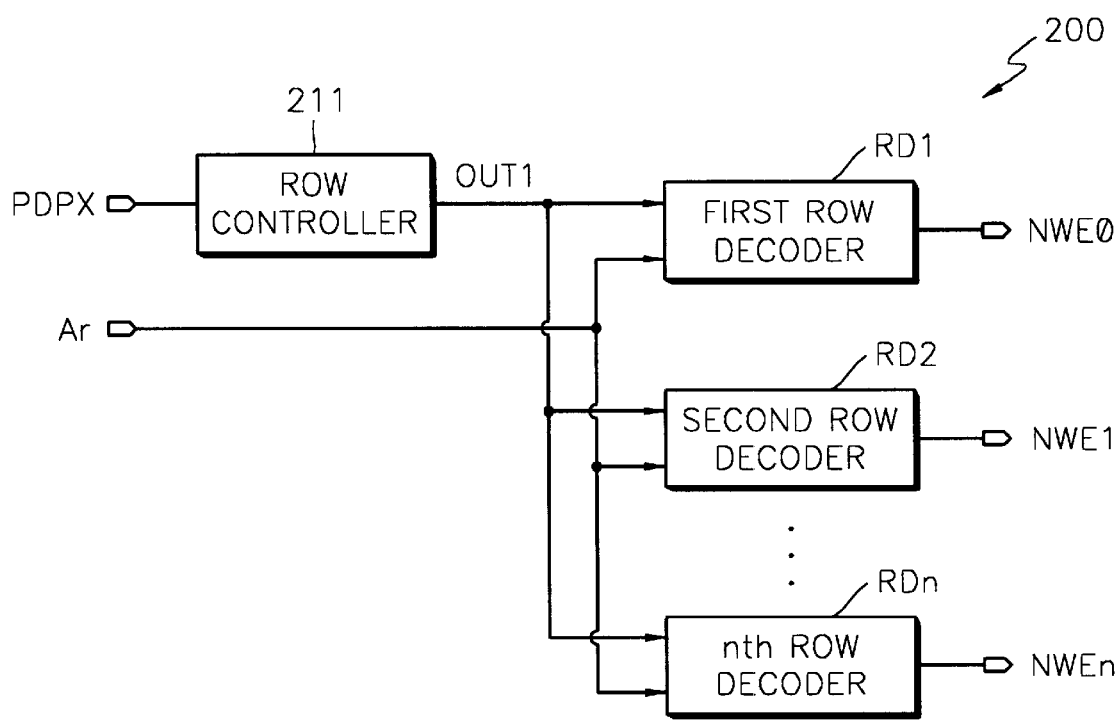
FIG. 2 is a block diagram of a preferred embodiment of a row address decoder according to th present invention.

FIG. 2 is a block diagram of a row address decoder 200 according to an embodiment of the present invention. The row address decoder 200 may be used in replacement of a conventional row address decoder such as the row decoder 121 in FIG. 1. Referring to FIG. 2, the row address decoder 200 includes a row controller 211 and first through nth row decoders RD1, . . . , RDn. The row controller 211 generates an output signal OUT1 in response to the control signal PDPX. The first through nth row decoders RD1, . . . , RDn are all coupled to the row controller 211 and output a plurality of word line enable signals NWE0, . . . , NWEn, respectively, in response to the output signal OUT1 and a row address signal Ar. The plurality of word line enable signals NWE0, . . . , NWEn activate a plurality of word lines WL0, . . . , WLn, respectively, to a high voltage through the word line drivers WD1, . . . , WDn shown in FIG. 1. The first through nth row decoders RD1, . . . , RDn each have the substantially same structure and function.

Figure 3:
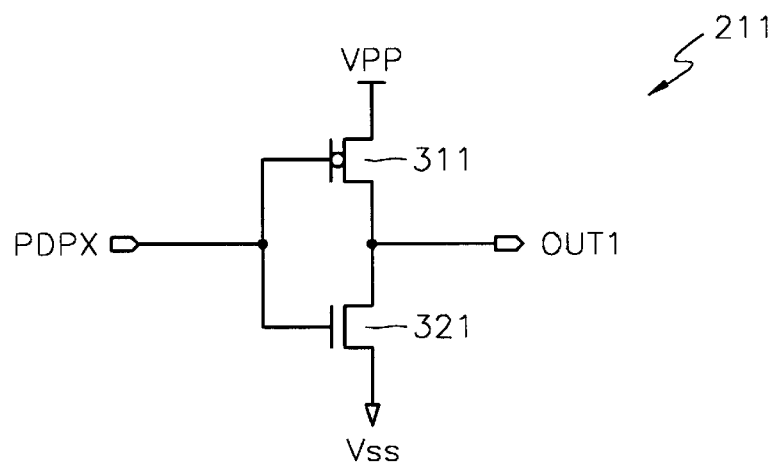
FIG. 3 is a circuit diagram of the row controller in FIG. 2.

FIG. 3 is a circuit diagram of a preferred embodiment of the row controller 211 in FIG. 2. Referring to FIG. 3, the row controller 211 includes a PMOS transistor 311 and an NMOS transistor 321. A high voltage VPP is applied to the source of the PMOS transistor 311, and the source of the NMOS transistor 321 is connected to a low voltage such as ground voltage Vss. Thus, the row controller 211 outputs the high voltage VPP when the control signal PDPX is logic low, thus enabling the first through nth row decoders RD1, . . . , RDn. The row controller 211 outputs the ground voltage Vss, which is logic low voltage, when the control signal PDPX is logic high, thus changing the state of the first through nth row decoders RD1, . . . , RDn to a stand-by state. The high voltage VPP may need to be higher than a power supply voltage Vcc to effectively drive the word lines WL0, . . . , WLn.

Thus, the row controller 211 outputs the high voltage VPP when the first through nth row decoders RD1, . . . , RDn are in a normal operation state, and outputs the ground voltage Vss when the first through nth row decoders RD1, . . . , RDn are in a stand-by state.

Figure 4:
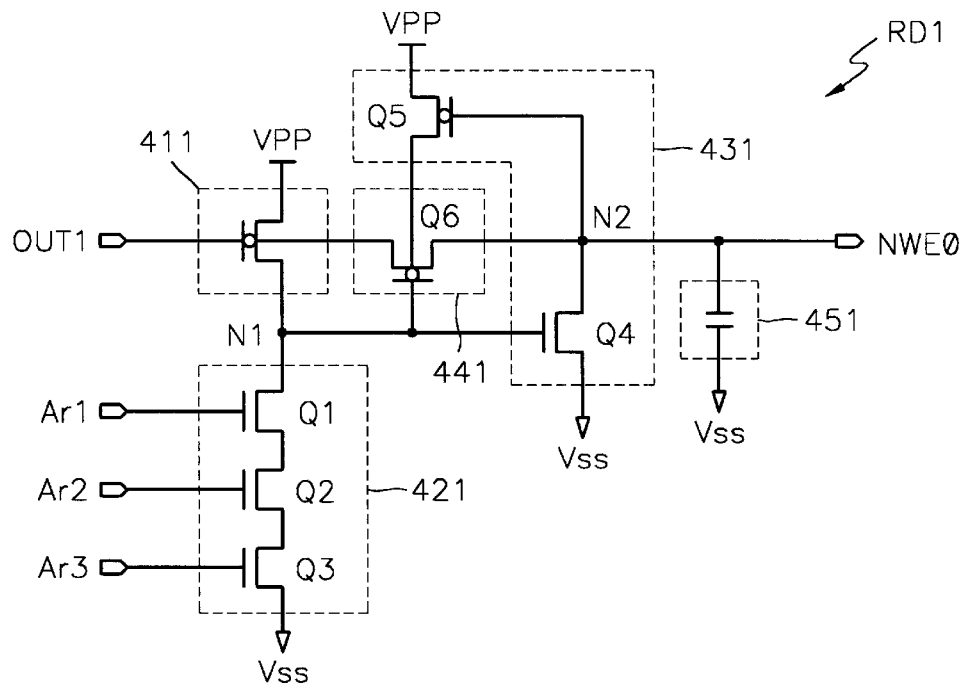
FIG. 4 is a circuit diagram of the first row deco der in FIG. 2.

FIG. 4 is a circuit diagram of a preferred embodiment of the first row decoder RD1. Referring to FIG. 4, the first row decoder RD1 includes a pull-up portion 411, a decoding portion 421, a latch portion 431, a driver 441 and a noise removing portion 451. Because the first through nth row decoders RD1, . . . , RDn each have the substantially same structure and function, only the first row decoder RD1 will be described.

The pull-up portion 411 is responsive to the output signal OUT1 of the row controller 211. The pull-up portion 411 includes a PMOS transistor having a source to which the high voltage VPP is applied, a gate to which the output signal OUT1 of the row controller 211 is applied and a drain coupled to a node N1. Thus, when the output signal OUT1 of the row controller 211 is the ground voltage Vss, the pull-up portion 411 is turned on to pull up the node NI to the high voltage VPP. When the output signal OUT1 of the row controller 211 is the high voltage VPP, the pull-up portion 411 is turned off, so that the node Ni is not pulled up to the high voltage VPP.

The decoding portion 421 is responsive to row address bits Ar1, Ar2 and Ar3 of a row address signal Ar. The decoding portion 421 includes NMOS transistors Q1, Q2 and Q3, each of which is turned on by each of the row address bits Ar1, Ar2 and Ar3, respectively. The NMOS transistors Q1, Q2 and Q3 are serially coupled between the node N1 and the ground voltage Vss. When the row address bits Ar1, Ar2 and Ar3 are all logic high, the NMOS transistors Q1, Q2 and Q3 are all turned on, so that the node N1 is pulled down to the ground voltage Vss. However, when at least one of the row address bits Ar1, Ar2 and Ar3 is logic low, corresponding at least one of the NMOS transistors Q1, Q2 and Q3 is turned off so that the node N1 is not pulled down to the ground voltage Vss.

The latch portion 431 latches a word line enable signal NWE0 to a predetermined voltage. The latch portion 431 includes a PMOS transistor Q5 and an NMOS transistor Q4. The high voltage VPP is applied to the source of the PMOS transistor Q5, and the ground voltage Vss is applied to the source of the NMOS transistor Q4. The gate of the NMOS transistor Q4 and the drain of the PMOS transistor Q5 are coupled to the node N1, and the drain of the NMOS transistor Q4 and the gate of the PMOS transistor Q5 are coupled to a node N2. Thus, when the voltage level of the node N1 is the high voltage VPP, the NMOS transistor Q4 and the PMOS transistor Q5 are turned on, so that the node N2 is latched to the ground voltage Vss. The word line enable signal NWE0 connected to the node N2 maintains the ground voltage. When the node N1 is at the ground voltage Vss, the NMOS transistor Q4 and the PMOS transistor Q5 are turned off, and the driver 441 is turned on. As a result, the word line enable signal NWE0 is activated to a boost voltage level.

The driver 441 is gated by the voltage of the node N1. The driver 441 comprises a PMOS transistor Q6 having a source, which receives the output signal OUT1 of the row controller 211, a gate coupled to the node N1, and a drain coupled to the node N2. Thus, when the voltage level of the node N1 is the ground voltage Vss, the driver 441 is turned on to transfer the output signal OUT1 of the row controller 211 to the node N2. Also, when the voltage level of the node N1 is the high voltage VPP, the driver 441 is turned off, so that the output signal OUT1 of the row controller 211 is not transferred to the node N2. When the driver 441 is turned off, the voltage level of the node N2 is determined according to the output of the latch portion 431.

In a conventional semiconductor memory device using a low internal supply voltage, for example, 2.0 volts or less, widths of the gates of MOS transistors in a row decoder are very narrow, so that threshold voltages of the MOS transistors are also lowered, for example, to 0.5 volts or less. When a threshold voltage of a MOS transistor in a driver of the row decoder is lowered, a slight voltage difference may exist between the source and drain of the MOS transistor when the row decoder is in a stand-by state and a voltage higher than the threshold voltage of the MOS transistor is applied to the gate of the MOS transistor. As a result, leakage current is generated from the MOS transistor in the driven of the row decoder.

However, in the driver 441 of the first row decoder RD1 in FIG. 4, the ground voltage Vss is applied to both the source and drain of the PMOS transistor Q6 when the first row decoder is in a stand-by state, so that leakage current is not generated from the PMOS transistor Q6. In a stand-by state, the output signal OUT1 of the row controller 211, which is logic low, is applied to the source of the PMOS transistor Q6, and the high voltage VPP is applied to the gate of the PMOS transistor Q6. As a result, the PMOS transistor Q6 is turned off and the NMOS transistor Q4 is turned on, so that the drain of the PMOS transistor Q6 is grounded. Since both the source and drain of the PMOS transistor Q6 are at the ground voltage Vss, the first row decoder RD1 does not generate leakage current in a stand-by state. Thus, when the first through nth row decoders RD1, . . . , RDn are in a stand-by state, leakage current is not generated from the first through nth row decoders RD1, . . . , RDn. The noise removing portion 451 includes a capacitor and removes noise generated in the node N2.

Operation of the row controller 211 and the first row decoder RD1 in FIGS. 3 and 4 will be described in detail with respect to a normal operation state and a stand-by state. It is assumed that when the first row decoder RD1 is in a normal operation state, the control signal PDPX is logic low. When the control signal PDPX is logic low, the PMOS transistor 311 of the row controller 211 is turned on, so that the row controller 211 outputs the high voltage VPP. Then, the pull-up portion 411 of the first row decoder RD1 is turned off in response to the high voltage VPP from the row controller 211. When the row address bits Ar1, Ar2 and Ar3 are all logic high, the node N1 is pulled down to the ground voltage Vss. When at least one of the row address bits Ar, Ar2 and Ar3 is logic low, the voltage level of the node N1 is determined according to the drain voltage of the PMOS transistor Q5 of the latch portion 431. If the row address bits Ar1, Ar2 and Ar3 are all logic high and the driver 441 is turned on, the high voltage VPP is transferred from the row controller 211 to the node N2, thereby activating the word line enable signal NWE0. When the word line enable signal NWE0 becomes active, the word line WL0 is enabled to the high voltage VPP.

When the state of the first row decoder RD1 is changed into a stand-by state, the control signal PDPX becomes logic high. When the control signal PDPX is logic high, the NMOS transistor 321 of the row controller 211 is turned on, so that the output of the row controller 211 is pulled down to the ground voltage Vss. As a result, the pull-up portion 411 is turned on, so that the voltage level at the node N1 is pulled up to the high voltage VPP, thereby turning on the NMOS transistor Q4 of the latch portion 431. Then, the voltage level at the node N2 is pulled down to the ground voltage Vss, so that the word line enable signal NWE0 is disabled. When the NMOS transistor Q4 is turned on, the PMOS transistor Q5 of the latch portion 431 is turned on, so that the node N1 remains at the high voltage VPP. Thus, the word line enable signal NWE0 remains disabled.

As described above, according to the present invention, when the first row decoder RD1 is in a stand-by state, the high voltage VPP is applied to the gate of the PMOS transistor Q6 of the driver 441 and the ground voltage Vss is applied to both the source and drain of the PMOS transistor Q6, so that leakage current is not generated from the PMOS transistor Q6. In a like manner, the leakage current is not generated from the first through nth row decoders RD1, . . . , RDn. As a result, power consumption of the semiconductor memory device 101 considerably decreases at a stand-by state.

Compared with a conventional row address decoder, the row address decoder 200 of the present invention additionally includes the row controller 211. However, because one row controller 211 may control all the row decoders regardless of the number of row decoders RD1, . . . , RDn, the row address decoder 200 needs only one row controller 211 occupying a very small area in the semiconductor memory device 101. The area occupied by the row controller 211 is also independent of the level of integration of the semiconductor memory device 101. Thus, the row controller 211 does not affect the size of the semiconductor memory device 101.

Figure 5:
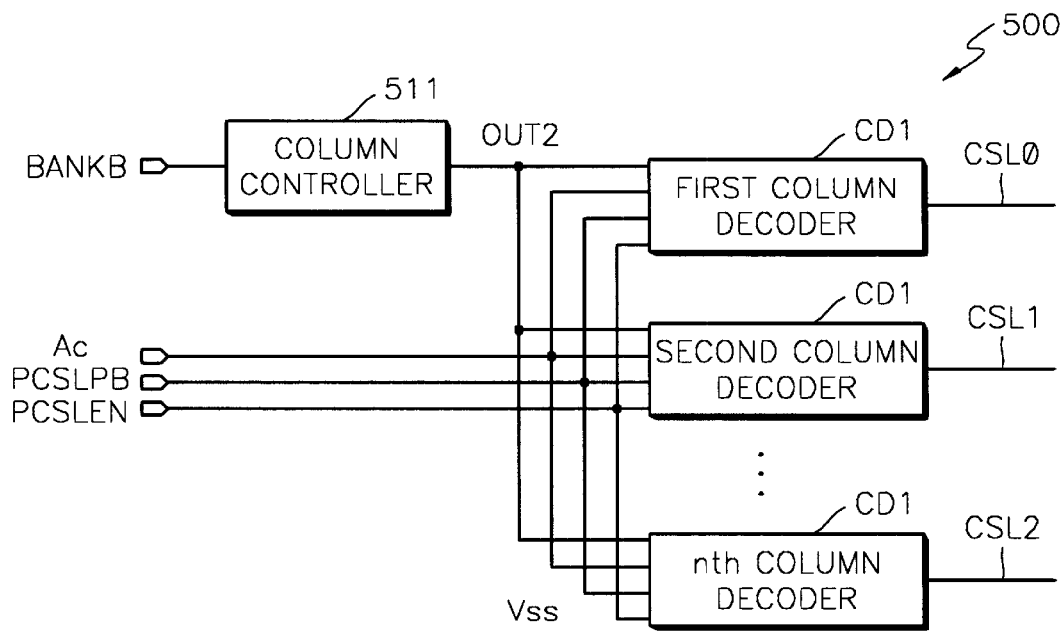
FIG. 5 is a block diagram of a preferred embodiment of a column address decoder according to the present invention.

FIG. 5 shows a preferred embodiment of a column address decoder 500 of the present invention. The column address decoder 500 may be used in replacement of a conventional column address decoder such as the column decoder 141 in FIG. 1. Referring to FIG. 5, the column address decoder 500 comprises a column controller 511 and first through nth column decoders CD1, . . . , CDn. The column controller 511 generates an output signal OUT2 in response to the first control signal BANKB. The first through nth column decoders CD1, . . . , CDn are all coupled to the column controller 511, and activate corresponding column selection lines CSL0, . . . , CSL1 in response to the output signal OUT2, a column address signal Ac from an external source, and second and third control signals PCSLPB and PCSLEN. The first through nth column decoders CD1, . . . , CDn each have the substantially same structure and function.

Figure 6:
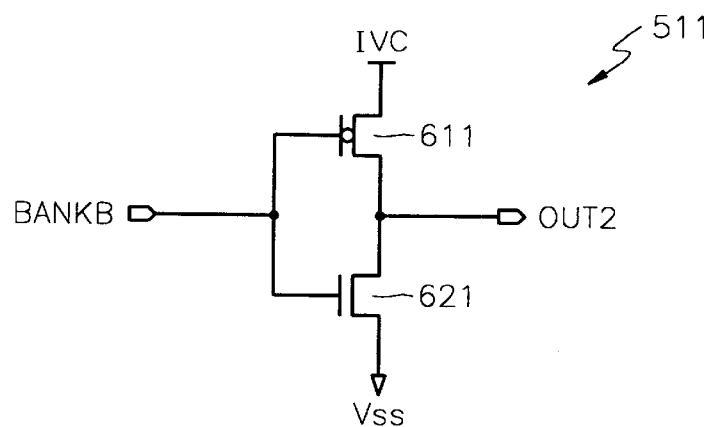
FIG. 6 is a circuit diagram of the column controller in FIG. 5.

FIG. 6 is a circuit diagram of a preferred embodiment of the column controller 511. Referring to FIG. 6, the column controller 511 includes a PMOS transistor 611 and an NMOS transistor 621. An internal supply voltage IVC is applied to the source of the PMOS transistor 611 and the source of the NMOS transistor 621 is connected to the ground voltage Vss. Thus, the column controller 511 outputs the internal supply voltage IVC when the first control signal BANKB is logic low, and outputs the ground voltage Vss when the first control signal BANKB is logic high. The internal supply voltage IVC is a voltage converted from a power supply voltage Vcc, which is input to the semiconductor memory device 101 from an external source, to be suitable for the semiconductor memory device 101. It is assumed that the first control signal BANKB is logic low when the first through nth column decoders CD1, . . . , CDn are in a normal operation state, and is logic high when the first through nth column decoders CD1, . . . , CDn are in a stand-by state.

Figure 7:
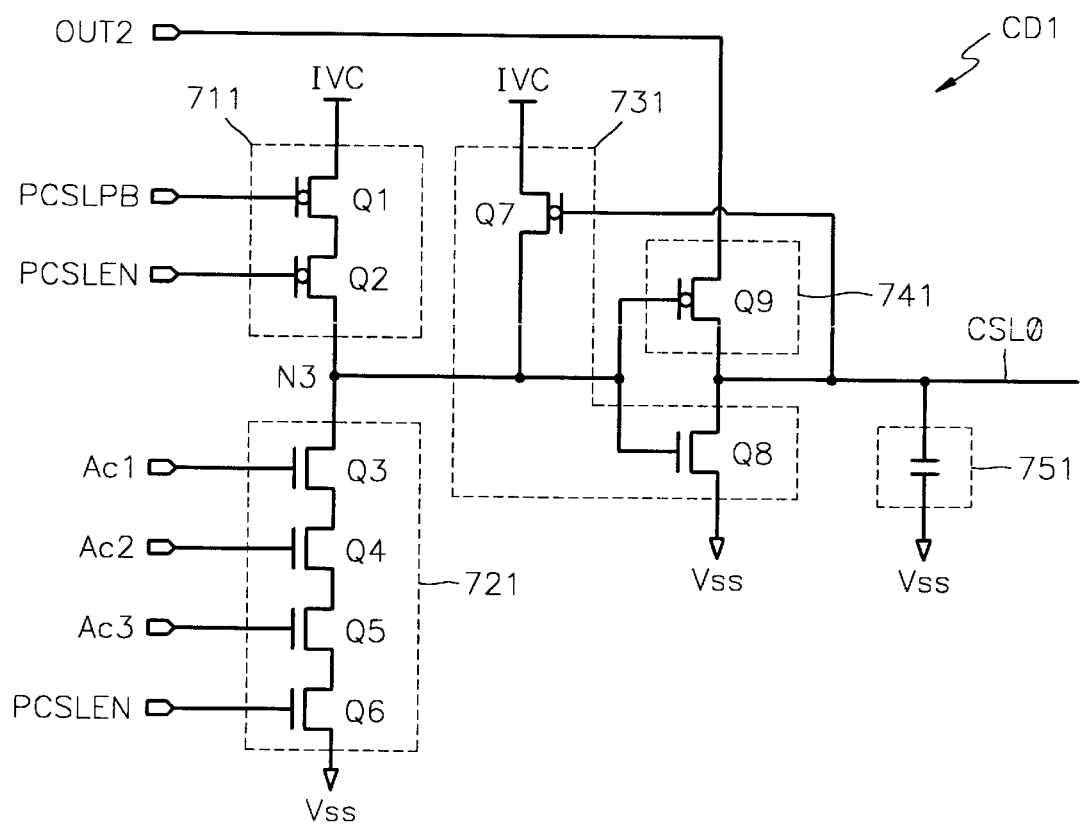
FIG. 7 is a circuit diagram of the first column decoder in FIG. 5.

FIG. 7 is a circuit diagram of a preferred embodiment of the first column decoder CD1. Referring to FIG. 7, the first column decoder CD 1 includes a pull-up portion 711, a decoding portion 721, a latch portion 731, a driver 741 and a noise removing portion 751. Because the first through nth column decoders CD1, . . . , CDn each have the substantially same structure and function, only the first column decoder CD I will be described.

The pull-up portion 711 is coupled between the internal supply voltage IVC and a node N3, and includes PMOS transistors Q1 and Q2 which are turned on by the second and third control signals PCSLPB and PCSLEN, respectively. Thus, when the second and third control signals PCSLPB and PCSLEN are logic low, the pull-up portion 711 is turned on to pull up a node N3 to the internal supply voltage IVC. However, when at least one of the second and third control signals PCSLPB and PCSLEN is logic high, the pull-up portion 711 is deactivated, so that the node N3 is not pulled up. The number of control signals, such as the second and third control signals PCSLPB and PCSLEN, input to the first column decoder CD 1 may be one or more according to the features of the first column decoder CD1. Then, the number of transistors, such as the PMOS transistors Q1 and Q2, in the pull-up portion 711 may also vary.

The decoding portion 721 pulls down the voltage at the node N3 to the ground voltage Vss in response to column address bits Ac1, Ac2 and Ac3 of the column address signal Ac, and the third control signal PCSLEN. The decoding portion 721 includes a plurality of NMOS transistors, for example, four NMOS transistors Q3, Q4, Q5 and Q6, which are turned on by the column address bits Ac1, Ac2 and Ac3 and the third control signal PCSLEN. The NMOS transistors Q3, Q4, Q5 and Q6 are serially connected between the node N3 and the ground voltage Vss. Thus, when the column address bits Ac1, Ac2 and Ac3 and the third control signal PCSLEN are all logic high, the decoding portion 721 is activated to provide ground voltage Vss at the node N3. When at least one of the column address bits Ac1, Ac2 and Ac3 or the third control signal PCSLEN is logic low, the decoding portion 721 does not supply ground voltage Vss to the node N3.

The latch portion 731 is connected between the node N3 and a column selection line CSL0. The latch portion 731 includes a PMOS transistor Q7 and an NMOS transistor Q8. The internal supply voltage IVC is applied to the source of the PMOS transistor Q7, and the ground voltage Vss is applied to the source of the NMOS transistor Q8. The gate of the NMOS transistor Q8 and the drain of the PMOS transistor Q7 are coupled to the node N3, and a drain of the NMOS transistor Q8 and a gate of the PMOS transistor Q7 are coupled to the column selection line CSL0. Thus, the latch portion 731 is activated to latch the column selection line CSL0 to the ground voltage Vss when the internal supply voltage IVC is provided at the node N3. When the ground voltage Vss is provided at the node N3, the latch portion 731 is deactivated, so that the column selection line CSL0 is not latched to the ground level Vss.

The driver 741 includes a PMOS transistor Q9 having a source coupled to the column controller 511, a gate coupled to the node N3 and a drain coupled to the column selection line CSL0. Thus, when the ground voltage Vss is provided at the node N3, the driver 741 is turned on, thereby increasing the voltage level of the column selection line CSL0 to the voltage level of the output signal OUT2. When the node N3 is provided with the internal supply voltage, the driver 741 is turned off, so that the voltage level of the column selection line CSL0 is not raised to the internal supply voltage IVC. The noise removing portion 751 includes a capacitor and removes noise generated in the column selection line CSL0.

The operation of the first column decoder CD1 in a normal operation state and in a stand-by state will be described with reference to FIGS. 6 and 7. First, it is assumed that when the first column decoder CD1 is in a normal operation state, the first control signal BANKB is logic low, and the second and third control signals PCSLPB and PCSLEN are logic high. When the first control signal BANKB is logic low, the output of the column controller 511 is pulled up to the internal power voltage IVC, so that the internal supply voltage IVC is output from the column controller 511. Because both the second and third control signals PCSLPB and PCSLEN are logic high in this state, the pull-up portion 711 is turned off. Also, when all the column address bits Ac1, Ac2 and Ac3 are logic high, the decoding portion 721 is turned on and the driver 741 is turned on. As a result, the voltage level of the column selection line CSL0 is raised to the internal supply voltage IVC, thus activating the column selection line CSL0.

When the first column decoder CD1 is in a stand-by state, the first control signal BANKB is logic high and the second and third control signals PCSLPB and PCSLEN are logic low. When the first control signal BANKB is logic high, the NMOS transistor 621 of the column controller 511 is turned on, so that the output of the column controller 511 is pulled down to the ground voltage Vss. Because both the second and third control signals PCSLPB and PCSLEN are logic low, the pull-up portion 711 is turned on and the decoding portion 721 is deactivated regardless of the column address bits Ac1, Ac2 and Ac3, so that the voltage level of the node N3 is raised to the internal supply voltage IVC. As a result, the NMOS transistor Q8 is turned on and the driver 741 is turned off, so that the voltage level of the column selection line CSL0 is lowered to ground voltage Vss. Thus, the column selection line CSL0 is disabled. Accordingly, the column selection line CSL0 remains at the ground voltage level Vss.

As described above, when the first column decoder CD1 is in a stand-by state, the high voltage IVC is applied to the gate of the PMOS transistor Q9 of the driver 741 and the ground voltage Vss is applied to both the source and drain of the PMOS transistor Q9, so that leakage current is not generated from the PMOS transistor Q9. In a like manner, the first through nth column decoders CD1, ..., CDn do not generate leakage current while they are in a stand-by state, and thus power consumption of the semiconductor memory device is considerably reduced.

Compared with a conventional column address decoder, the column address decoder 500 of the present invention additionally includes the column controller 511. However, because one column controller 511 may control all the column decoders regardless of the number of column decoders CD1, ..., CDn, the column address decoder 500 needs only one column controller 511 occupying a very small area in the semiconductor memory device 101. The area occupied by the column controller 511 is also independent of the level of integration of the semiconductor memory device 101. Thus, the column controller 511 does not affect the size of the semiconductor memory device 101.

The row address decoder and the column address decoder of the present invention may also be used in a composite semiconductor device having both memory circuits and general logic circuits. For example, logic circuit in a semiconductor device performs a predetermined logic operation with respect to signals from the row address and column address decoders, and/or providing outputs of the logic operation to the row address and column address decoders.

In the drawings and specification, there have been disclosed preferred embodiments of the invention. Although specific terms are employed in the description of the preferred embodiments, they are used in a generic and descriptive sense only and not for purpose of limitation. Also, it will be understood by those skilled in the art that various changes in form and details may be made therein without departing from the spirit and scope of the invention as defined by the appended claims.

What is claimed is:

1. A semiconductor device having a plurality of memory cells connecting with a plurality of word lines, comprising:
   a node for receiving a power supply voltage (Vcc) applied to the semiconductor device;
   a row controller for generating an output signal in response to a control signal representing one of a normal operation state and a stand-by state; and
   a plurality of row decoders connected between the row controller and the plurality of word lines, each row decoder for activating a corresponding word line in response to the output signal from the row controller and a row address signal from an external source,
   wherein the output signal of the row controller is a high voltage when the plurality of row decoders are in the normal operation state, and the output signal is a ground voltage when the plurality of row decoders are in the stand-by state.

2. The semiconductor device of claim 1, wherein the high voltage of the output signal is higher than the power supply voltage (Vcc) applied to the semiconductor device.

3. The semiconductor device of claim 1, wherein the control signal applied to the row controller is logic low when the plurality of row decoders are in the normal operation state, and the control signal is logic high when the plurality of row decoders are in the stand-by state.

4. The semiconductor device of claim 1, wherein the power supply voltage (Vcc) applied to the semiconductor device is about 2.0 volts or less.

5. The semiconductor memory device of claim 1, wherein each of the plurality of row decoders comprises:
   a pull-up portion receiving the output signal from the row controller, for generating the low voltage when the output signal of the row controller is the high voltage;
   a decoding portion coupled to the pull-up portion, for receiving the row address signal and decoding the received row address signal;
   a latch portion coupled to a node to which the pull-up portion and the decoding portion are coupled, for latching the corresponding word line of the plurality of word lines to logic low when a voltage level of the node is a first voltage level; and
   a driver coupled to the node and the row controller, for activating the corresponding word line when the voltage level of the node is a second voltage level, and making the corresponding word line inactive when the voltage level of the node is the first voltage level, wherein an input of the driver receives the output signal from the row controller.

6. The semiconductor memory device of claim 5, wherein the first voltage level is the high voltage and the second voltage level is the ground voltage.

7. The semiconductor memory device of claim 1, wherein each of the plurality of row decoders comprises:
   a first PMOS transistor controlled by the output signal of the row controller, the first PMOS transistor having a source to which the high voltage is applied;
   a plurality of NMOS transistors serially connected between a drain of the first PMOS transistor and a ground, the plurality of transistors being turned on by the row address signal to provide the ground voltage to the drain of the first PMOS transistor;
   a latch portion coupled to the drain of the first PMOS transistor, for latching the corresponding word line of the plurality of word lines to the ground voltage when the high voltage is provided at the drain of the first PMOS transistor; and a second PMOS transistor coupled to the drain of the first PMOS transistor and the row controller, the second PMOS transistor being turned on when the ground voltage is provided at the drain of the first PMOS transistor, to transfer the output signal of the row controller to the corresponding word line, and being turned off when the high voltage is provided at the drain of the first PMOS transistor, wherein the ground voltage is provided at the source and the drain of the second PMOS transistor when the second PMOS transistor is turned off.

8. The semiconductor device of claim 7, wherein a threshold voltage of the second PMOS transistor is about 0.4 volts or less.

9. The semiconductor device of claim 1, further including logic circuits connected with the row controller and the plurality of row decoders, for performing a predetermined logic operation and providing outputs of the logic operation to the row controller and the plurality of row decoders.

10. A semiconductor device having a plurality of memory cells connecting with a plurality of bit line pairs which are selectively connected to corresponding input/output line pairs in response to a plurality of column selection lines to transfer data from/to an external source, the semiconductor memory device comprising:

a column controller for receiving an internal supply voltage and for generating an output signal in response to a first control signal; and a plurality of column decoders coupled the column controller, each column decoder for activating a corresponding column selection line of the plurality of column selection lines in response to the output signal of the column controller, a column address signal, and a second control signal, wherein the output signal of the column controller is the internal supply voltage when the plurality of column decoders are in the normal operation state, and the output signal is a ground voltage when the plurality of column decoders are in the stand-by state.

11. The semiconductor device of claim 10, wherein the first control signal is logic low when the plurality of column decoders are in the normal operation state, and the first control signal is logic high when the plurality of column decoders are in the stand-by state.

12. The semiconductor device of claim 10, wherein the semiconductor device uses a low supply voltage of about 2.0 volts or less.

13. The semiconductor device of claim 10, wherein each column decoder comprises:

a pull-up portion for receiving the second control signal and outputting the internal supply voltage when the second control signal represents the stand-by state;

a decoding portion coupled to an output of the pull-up portion, for providing the ground voltage at the output of the pull-up portion in response to the column address signal;

a latch portion coupled to the output of the pull-up portion, for latching the corresponding column selection line to the ground voltage when the plurality of column decoders are in the stand-by state; and a driver coupled to the output of the pull-up portion and the column controller, for activating the corresponding column selection line when the plurality of column decoders are in the normal operation state.

14. The semiconductor device of claim 13, wherein the driver includes an input terminal receiving the output signal from the column controller and an output terminal connected to the corresponding column selection line, the input and output terminals being grounded at the stand-by state.

15. The semiconductor device of claim 10, wherein each column decoder comprises:

a first PMOS transistor controlled by the second control signal, an output of the first PMOS transistor is the internal supply voltage when the second control signal represents the stand-by state;

a plurality of NMOS transistors serially connected between a drain of the first PMOS transistor and the ground voltage, the plurality of transistors being turned on in response to the column address signal to provide the ground voltage to the drain of the first PMOS transistor;

a latch portion coupled to the drain of the first PMOS transistor, the latch portion being activated when the drain of the first PMOS transistor outputs the internal supply voltage, to maintain the corresponding column selection line at the ground voltage; and a second PMOS transistor coupled to the drain of the first PMOS transistor, the second PMOS transistor being turned on when the drain of the first PMOS transistor outputs the ground voltage, to activate the corresponding column selection line to the internal supply voltage.

16. The semiconductor device of claim 15, wherein the second control signal is logic low when the second control signal represents the stand-by state.

17. The semiconductor device of claim 15, wherein a threshold voltage of the second PMOS transistor is about 0.4 volts or less.

18. The semiconductor device of claim 10, wherein the first control signal applied to the column controller is logic high when the plurality of column decoders are in the stand-by state, and is logic low when the plurality of column decoders are in the normal operation state.

19. The semiconductor device of claim 10, further including logic circuits connected with the column controller and the plurality of column decoders, for operating a predetermined logic operation and providing outputs of the logic operation to the column controller and the plurality of column decoders.

* * * * *